United States Patent [19]
Imanishi et al.

[11] Patent Number: 5,965,841
[45] Date of Patent: Oct. 12, 1999

[54] THERMOELECTRIC CONVERSION MATERIAL AND A PROCESS FOR PRODUCING THE SAME

[75] Inventors: Yuichiro Imanishi; Makoto Miyoshi, both of Nagoya; Kazuhiko Shinohara; Masakazu Kobayashi, both of Yokohama, all of Japan

[73] Assignees: NGK Insulators, Ltd.; Nissan Motor Co., Ltd., both of Japan

[21] Appl. No.: 08/820,023

[22] Filed: Mar. 19, 1997

[30] Foreign Application Priority Data

Mar. 19, 1996 [JP] Japan .................................. 8-088975

[51] Int. Cl.⁶ .................................................. H01L 35/20
[52] U.S. Cl. ............................................................ 136/240
[58] Field of Search .................................. 136/201, 236.1, 136/238, 240; 419/31, 38, 44, 53, 55, 56, 57; 252/62.3 T; 420/576

[56] References Cited

U.S. PATENT DOCUMENTS

| 3,454,370 | 7/1969 | Castellion ................................. 23/315 |
| 3,840,652 | 10/1974 | Albers ...................................... 423/509 |
| 5,610,366 | 3/1997 | Fleurial et al. .......................... 136/202 |

FOREIGN PATENT DOCUMENTS

WO/95/04377  2/1995  WIPO .

OTHER PUBLICATIONS

"Investigations of Several New Advanced Thermoelectric Materials at the Jet Propulsion Laboratory"; T. Caillat, et al.; Proceedings Intersociety Energy Conversion Engineering Conference; Boston, 14th, 1979; Aug. 8, 1993, pp. 1.245–1.248, XP000428309.

"Thermoelectric Properties of $(Pd,Co)Sb_3$ Compounds with Skutterudite Structure "; K. Matsubara, T. Iyanaga, T. Tsubouchi, K. Kishimoto and T. Koyanagi; Department of Electrical and Electronic Engineering, Yamaguchi University, Japan, pp. 226–229. 1995.

"On the Doping of the Semicondutor Compound $CoSb_3$"; L. D. Dudkin and N. Kh. Abrikosov; pp. 126–133.

"Investigation of the Thermoelectric Properties of $CoSb_3$, with Sn, Te and Ni Impurities"; B. N. Zobrina and L. D. Dudkin; pp. 1668–1674 and acknowledgments.

"Preparation and Thermoelectric Properties of p– and n–Type CoSb3"; Thierry Caillat, Alex Borshchevsky and Jean–Pierre Fleurial; 1995 American Institute of Physics, pp. 58–61 1995.

*Primary Examiner*—Bruce F. Bell
*Assistant Examiner*—Thomas H. Parsons
*Attorney, Agent, or Firm*—Parkhurst & Wendel, L.L.P

[57] ABSTRACT

A thermoelectric conversion material includes a sintered body composed mainly of cobalt and antimony, wherein cobalt and antimony as main components form a compound of cubic $CoSb_3$, a phase composed mainly of an Sb phase is contained as a secondary phase, and a volumetric rate of the phase closed mainly of the Sb phase is less than 10 vol % with respect to 100 vol % of the thermoelectric conversion material.

3 Claims, 4 Drawing Sheets

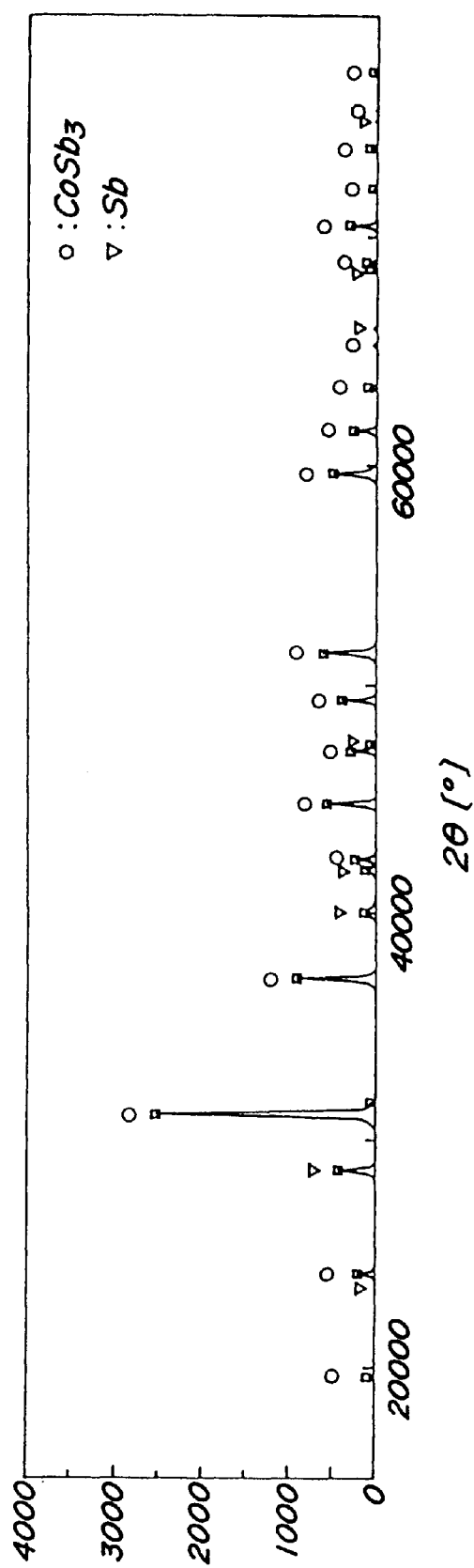

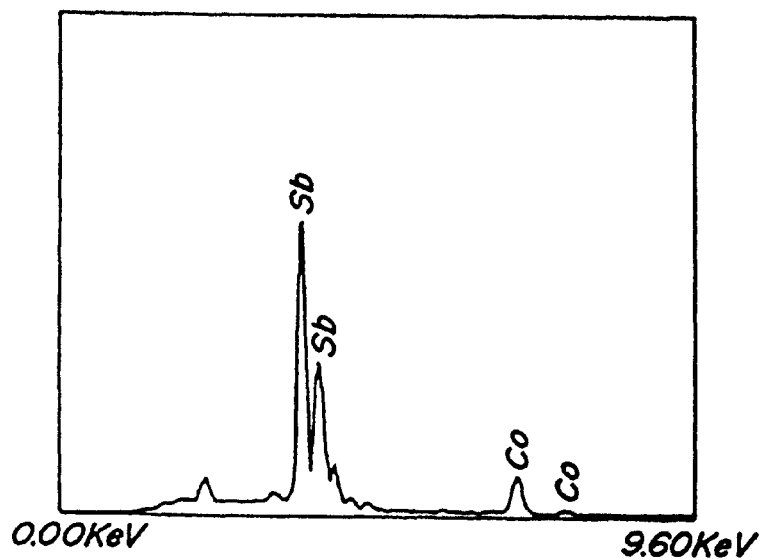
FIG_2b
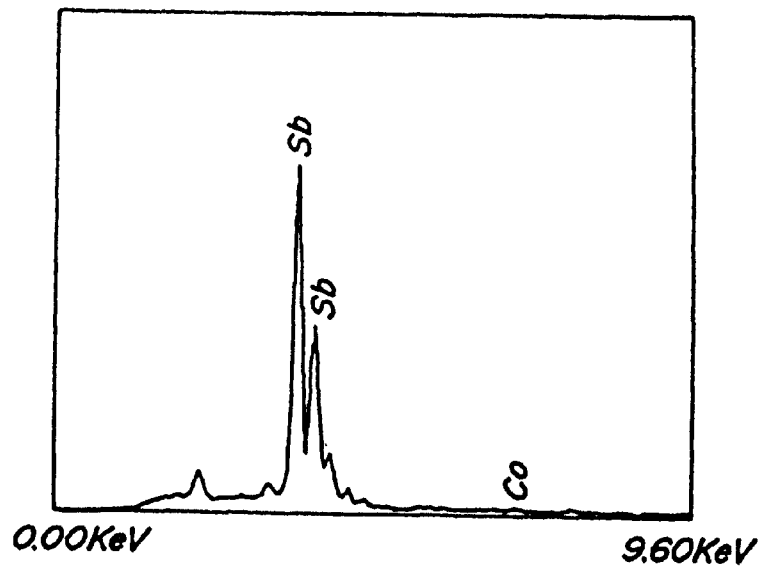
FIG_2c

FIG_3
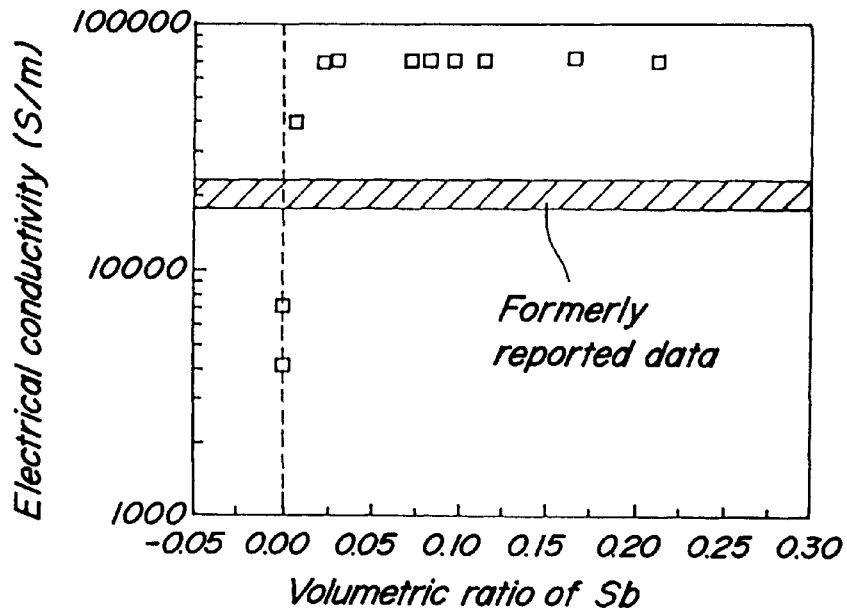
FIG_4
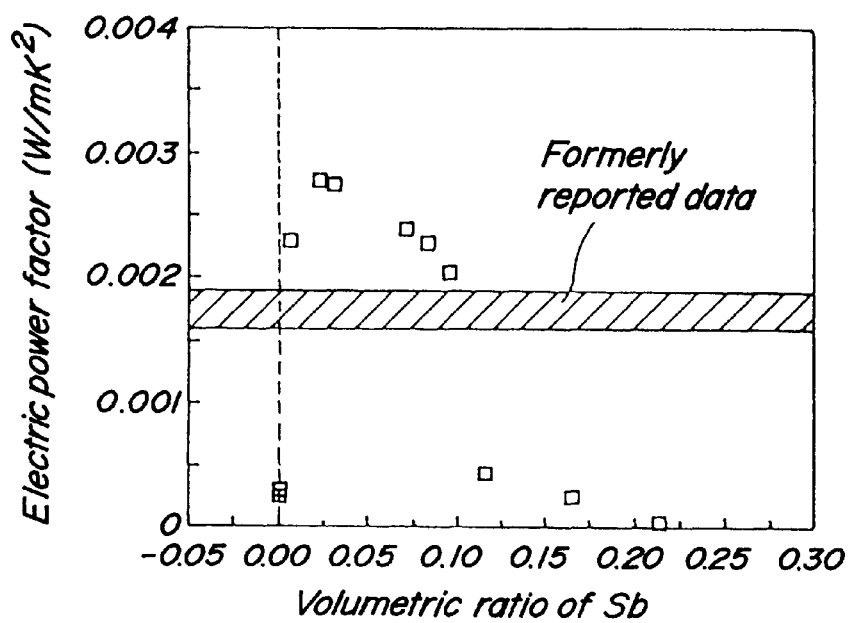

THERMOELECTRIC CONVERSION MATERIAL AND A PROCESS FOR PRODUCING THE SAME

BACKGROUND OF THE INVENTION

(1) Field of the Invention

The present invention relates to thermoelectric conversion materials to be used for exhibiting so-called thermoelectric effects (direct energy conversion without relying upon moving parts) such as thermoelectric generation due to the Seebeck effect or thermoelectric cooling due to the Peltier effect. The invention also relates to a process for producing such thermoelectric conversion materials.

(2) Related Art of the Invention

The thermoelectric conversion such as thermoelectric generation and thermoelectric cooling by using a thermoelectric conversion material enables the production of a simplified energy direct conversion device which has no moving parts causing vibration, noise, abrasion, etc., is simple in structure with high reliability, possesses long service life, and is simple to maintain. For example, the thermoelectric conversion is suitable for directly obtaining DC electric power by combustion of a variety of fossil fuels, etc. and for controlling the temperature without use of a cooling medium.

In evaluating the performances of the thermoelectric conversion materials, an electric power factor Q and a performance index Z (also commonly known as "Figure-of-merit") expressed by the following equations are used.

$$Q = \sigma \alpha^2, \quad Z = \sigma \alpha^2 / K$$

in which $\alpha$ is a Seebeck coefficient, $\sigma$ is an electrical conductivity, and $\kappa$ is a heat conductivity. As to the thermoelectric conversion material, it is desired that the performance index Z is large, that is, the Seebeck coefficient is high, the electric conductivity $\sigma$ is high, and thermal conductivity $\kappa$ is low.

When the thermoelectric conversion material is used for thermoelectric cooling or thermoelectric generation, particularly when the thermoelectric conversion material is used as a thermoelectric cooler for a high-temperature generating member or a thermoelectric generator for the utilization of waste heat, it is desired that the thermoelectric conversion material has a high Figure-of-merit Z of not less than $3 \times 10^{-3}$ [1/K] as the thermoelectric performance, and operates stably in a use condition for a long time period. Further, it is also desired that the thermoelectric conversion material has sufficient heat resistance and chemical stability in a temperature range of not less than 300° C. Furthermore, if a cooler utilizing thermoelectric cooling or a thermoelectric generator is mass produced for vehicles, etc., it is desired that a material to be effectively produced at a low cost and a process for producing the same are available.

Heretofore, tellurium based compounds such as $Bi_2Te_3$, $Bi_2Sb_8Te_{15}$, and $BiTe_2Se$ have been known as thermoelectric conversion materials having high performance indexes $Z = 3 \times 10^{-3}$ [1/K]. Further, thermoelectric conversion materials using Sb compounds such as $TSb_3$ (T: Co, Ir, Ru), for example, thermoelectric conversion materials in which an impurity for determining a type of electrical conduction is added into a material having a main component of $CoSb_3$ in its chemical composition are described in the following documents.

1) L. D. Dadkin and N. Kh. AbrikoSov, Soviet Physics Solid State Physics (1959) pp. 126–133
2) B. N. Zobrinaand, L. D. Dudkin, Soviet Physics Solid State Physics (1960) pp. 1668–1674
3) K. Matsubara, T. Iyanaga, T. Tsubouchi, K. Kishimoto and T. Koyanagi, American Institute of Physics (1995) pp 226–229.

However, although the thermoelectric conversion materials made of the Te based compounds represented by Bi—Te series have large performance indexes Z of about $3 \times 10^{-3}$ [1/K] at near room temperature, their characteristics are deteriorated at not less than 300° C., so that the use temperature is unfavorably limited to a large extent. Further, since a volatile component such as Te or Se is contained in the compositions of the materials, these thermoelectric conversion materials unfavorably have low melting points and lack chemical stability. Furthermore, since a producing process is complex, the characteristics are likely to vary due to changes in the composition, and the intended materials cannot be unfavorably effectively mass produced. In addition, a poisonous element (Te) is contained in the starting materials, and since an expensive starting material having a high purity is needed, an inexpensive product cannot be offered.

As to thermoelectric conversion materials composed mainly of Sb compounds such as $TSb_3$ (T: Co, Ir, Ru), for example, $CoSb_3$ in their chemical compositions, it is known that raw materials are relatively inexpensive and contain no poisonous elements, and chemically stable even in a temperature range of not less than 300° C. Although the use temperature of the thermoelectric conversion material having the chemical composition of $CoSb_3$ is wider than that of the Bi—Te based material, the former is inferior to the latter in that the electric conductivity is lower and the Figure-of-merit ($Z < 1 \times 10^{-3}$ [1/K]) is far smaller.

It is considered that the formerly known thermoelectric conversion material having the chemical composition of $CoSb_3$ has only a cubic $CoSb_3$ crystalline phase as its constituting chemical phase, and that other crystalline phases ($CoSb$, $CoSb_2$, Sb) function to deteriorate the thermoelectric characteristics.

However, it is known that when such a thermoelectric conversion material is obtained by melting $CoSb_3$, phases other than $CoSb_3$ (e.g., $CoSb$, $CoSb_2$, Sb) (e.g., $CoSb$, $CoSb_2$, Sb) are precipitated during solidification. In order to attain a single CoSb phase, heat treatment needs to be effected at around 600° C. for about 200 hours. This unfavorably prolongs the producing period.

Further, according to a process for producing a thermoelectric material by grinding CoSb obtained through melting and sintering the milled powder, since a foreign phase precipitated during the melting, that is, $CoSb$ and $CoSb_2$ having densities higher than that of $CoSb_3$ are converted in phase to $CoSb_3$ during firing, the volume of the material increases to hinder the sintering. For example, a sufficiently densified thermoelectric conversion material has not been obtained even by hot press under the condition that the pressure was $5 \times 10^3$ kg/cm$^2$ and the temperature was 600° C. (K. Matsubara, T. Iyanaga, T. Tsbouchi, K. Kishimoto and T. Koyanagi, American Institute of Physics (1995) pp. 226–229). As a result, a material fired under atmospheric pressure is brittle, and has conspicuously low electrical conductivity and extremely poor thermoelectric property.

As mentioned above, although the thermoelectric conversion material having the chemical composition of $CoSb_3$ has the wider usable temperature range as compared with the Bi—Te based one, the former has the problems in terms of both the material characteristics and the production process. Therefore, there has been demanded a thermoelectric conversion material which is chemically stable and unlikely to be degraded, has excellent thermoelectric property and high strength in a wide temperature range of from room temperature to not less than 300° C. Further, a simplified process for producing such a thermoelectric conversion material has been demanded.

SUMMARY OF THE INVENTION

The present invention has been accomplished in light of the conventional problems mentioned above, and provides a thermoelectric conversion material which has excellent thermoelectric properties and high strength, and is chemically stable and unlikely to be degraded in a wide temperature range of from room temperature to not less than 300° C. Further, the invention provides a simplified process for producing such a thermoelectric conversion material.

The thermoelectric conversion material according to the present invention comprises a sintered body composed mainly of cobalt and antimony, wherein cobalt and antimony as main components form a compound of cubic $CoSb_3$, a phase composed mainly of an Sb phase is contained as a secondary phase, and a volumetric rate of the phase composed mainly of the Sb phase is less than 10 vol % with respect to 100 vol % of the thermoelectric conversion material. As a preferred embodiment, the thermoelectric conversion material in which the sintered body comprises particles of the cubic $CoSb_3$ as a main component, grain boundaries composed mainly of the Sb phase as a semi-metal, and voids. The above-mentioned conventional problems are solved by the construction of the present invention directed to the thermoelectric conversion material.

These and other objects, features and advantages of the invention will be appreciated upon reading the following description of the invention when taken in conjunction with the attached drawings, with the understanding that some modifications, variations and changes of the same could be easily made by the skilled person in the art to which the invention pertains.

BRIEF DESCRIPTION OF THE DRAWINGS

For a better understanding of the invention, reference is made to the attached drawings, wherein:

FIG. 1 is a chart of a measurement result by X-ray diffraction of a powder;

FIGS. 2a, 2b and 2c are an electron microscopic photograph for showing a microstructure of a sample, and charts for showing analytical results at points A and B by an energy dispersion X-ray analysis, respectively;

FIG. 3 is a graph showing the relationship between the volumetric rate of Sb and the electrical conductivity at 250° C.; and FIG. 4 is a graph showing the relationship between the volumetric rate of Sb and the electric power factor at 250° C.

DETAILED DESCRIPTION OF THE INVENTION

Figure 2A:
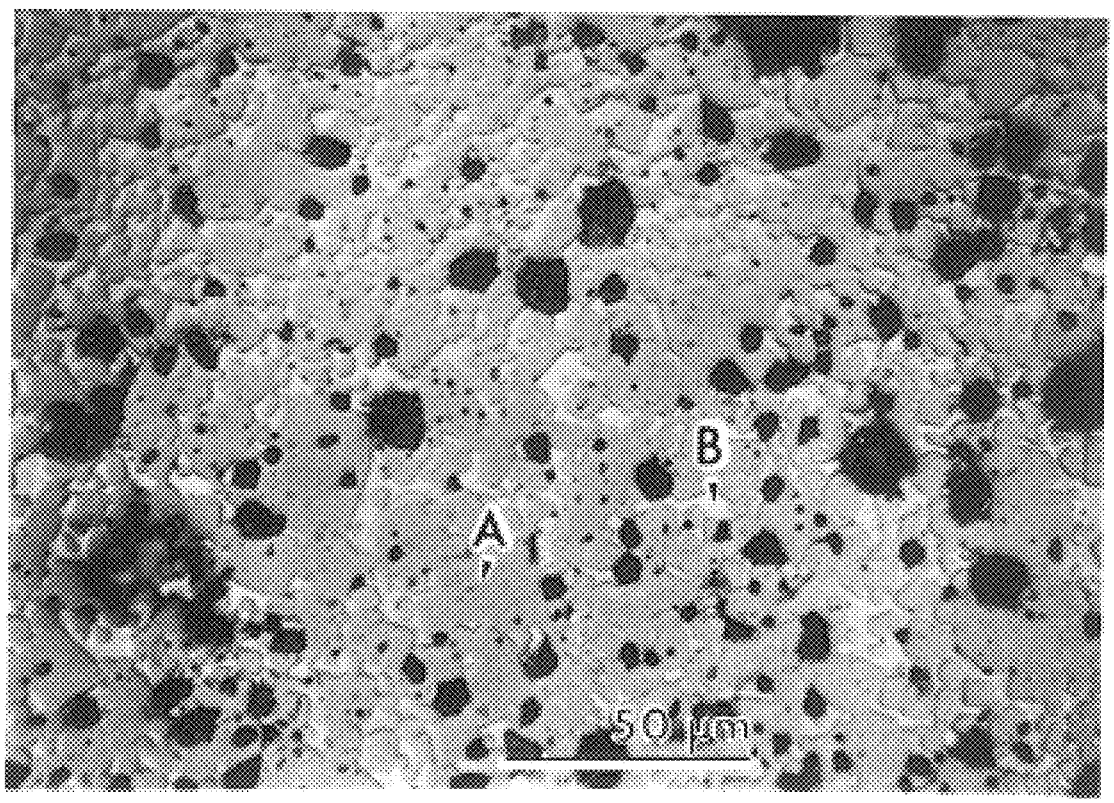

The process for producing a thermoelectric conversion material according to the present invention comprises the steps of press molding a powder composed mainly of cobalt and antimony, and thermally treating the thus molded product in a non-oxidizing atmosphere, wherein x is 3<x<3.4 in which x is an elementary content ratio (x=Sb/(Co+ additives)) between Sb and Co. As a preferred embodiment, a temperature of the thermally treating step is substantially not less than a liquid phase precipitating temperature of Sb.

The thermoelectric conversion material according to the present invention is composed mainly of the cobalt-antimony compound, which is expressed by the cubic $CoSb_3$.

Further, thermoelectric conversion materials in which a fine amount of an additive is added to determine a type of its electric conduction, that is, Co—Sb based materials having a basic skelton of $CoSb_3$ may be recited. These Co—Sb based materials include $Co_{1-z}M_zSb_3$ (M: Ni, Fe, Ru) and $Co(Sb_{1-z}T_z)_3$ (T: Sn, Te, Se, Pb, $0 \leq z \leq 0.1$).

In the thermoelectric conversion material according to the present invention, the cobalt-antimony compound as the main component is the cubic $CoSb_3$, and the phase composed mainly of the Sb phase is contained as the secondary phase. In this case, the volumetric rate of the Sb phase is less than 10 vol %. If the Sb phase as the secondary phase is contained in an amount of less than 10 vol %, with respect to 100 vol % of the thermoelectric conversion material, the Sb phase as the semi-metal functions to enhance a moving rate of a conductive carrier, so that the electrical conductivity is largely increased. In this case, the Seebeck coefficient also decreases, but the entire thermoelectric characteristics are greatly improved due to largely increased electrical conductivity. On the other hand, if Sb is contained in an amount beyond 10 vol. %, increase in the electrical conductivity due to the Sb phase is saturated to largely reduce the Seebeck coefficient. Consequently, the entire thermoelectric characteristics are largely deteriorated. Therefore, the Sb phase as the secondary phase needs to be contained in an amount of less than 10 vol. %.

Further, the thermoelectric conversion material according to the present invention comprises the sintered body composed mainly of cobalt and antimony, wherein the sintered body preferably comprises the particles composed mainly of cubic $CoSb_3$. The grain boundaries of the sintered body are preferably composed mainly of the Sb phase as the semi-metal. Ordinarily, strength of a sintered body containing no grain boundary phase is governed by strength of intergranular neck portions connecting the particles and strength of the particles themselves. If the Sb phase is distributed in the material as the grain boundary phase, strength of the grain boundary phase and strength between the grain boundaries and the particles are added to the above strength of the sintered body. Accordingly, the material having higher strength can be obtained. In addition, when the Sb phase having a high moving rate is distributed in the grain boundaries, this phase functions to eliminate an energy barrier at the grain boundaries so that the electric conductivity of the sintered body is increased. On the other hand, if the Sb phase exists inside the particles in an isolated manner, the Sb phase does not reduce the barrier at the grain boundaries, and no passages for a low conductive carrier having a small moving rate can be ensured. Consequently, the electrical conductivity of the sintered body is not increased. Therefore, the grain boundaries of the cobalt-antimony sintered body are preferably composed mainly of the Sb phase as the semi-metal.

The process for producing the thermoelectric conversion material according to the present invention comprises the steps of press molding a powder composed mainly of cobalt and antimony, and then thermally treating the molded product in the non-oxidizing atmosphere. As the non-oxidizing atmosphere, mention may be made of inert atmospheres such as argon and nitrogen, reducing atmospheres such as hydrogen, weak reducing atmospheres formed in using graphite as a thermally treating container or by simultaneously heating graphite pieces, mixed atmospheres obtained by selectively combining the above-recited atmospheres, and vacuum. As the powder composed mainly of cobalt and antimony, mention may be made of a powder obtained by measuring respectively given amounts of powdery starting materials of elements and mixing them, a powder obtained by grinding a material having a given elementary composition and produced through melting, or a powder obtained by selectively mixing the above powders to give a given ratio of elements contained.

In the process for producing the thermoelectric conversion material according to the present invention, as mentioned before, the powder composed mainly of cobalt and antimony is press molded, and then the molded product is thermally treated in the non-oxidizing atmosphere. In this case, it is necessary that the elementary content ratio x=Sb/(Co+additives) of the above powder is 3<x<3.4. If 3<x<3.4, the material finally obtained has a composition composed mainly of $CoSb_3$, wherein the secondary phase is the Sb phase in an amount of less than 10 vol. %. In this case, the excellent thermoelectric conversion material having high thermoelectric characteristics and high strength which contains the Sb phase to increase the moving rate of the conductive carrier can be obtained. On the other hand, if x is not more than 3, the above-mentioned effects cannot be obtained, because no Sb phase is precipitated by the thermal treatment. Further, if x is not less than 3.4, the thermoelectric characteristics of the material obtained by the thermal treatment are deteriorated, because the volumetric rate of the $CoSb_3$ phase having excellent thermoelectric characteristics are deteriorated. Therefore, it is necessary that the elementary content ratio x=Sb/(Co+additives) is 3<x<3.4.

As mentioned, the process for producing the thermoelectric conversion material according to the present invention comprises the steps of press molding the powder composed mainly of cobalt and antimony and then thermally treating the molded product in the non-oxidizing atmosphere. In this case, the temperature in the thermal treatment is preferably substantially not less than the liquid phase precipitating temperature of Sb. If the thermal treatment temperature is substantially not less than the liquid phase precipitating temperature of Sb, an excess amount of the Sb phase as considered in light of the stoichiometric composition of $CoSb_3$ exists without forming a composition between Co, and accordingly the liquid phase of Sb is formed between the particles constituting the $CoSb_3$ compound. Since this Sb liquid phase promotes the sintering during the thermal treatment, the resulting material is a dense thermoelectric conversion material having excellent thermoelectric characteristics and high strength which contains the Sb phase in the grain boundaries to enhance the strength of the material and the moving rate of the conductive carrier. Further, if the thermal treatment temperature is lower than the Sb liquid phase precipitating temperature, the sintering due to the liquid phase is not advanced, and the phases such as CoSb and $CoSb_2$ precipitated in the melting remain as different phases in the sintered body without being converted to the $CoSb_3$ phase. Therefore, the thermal treatment temperature is preferably substantially not less than the liquid phase precipitating temperature of Sb.

In the following, examples of the present invention will be explained.

EXPERIMENT

After granular Co, Sb and Pb were measured as starting materials by respective amounts, and an alloy ingot was produced by melting them in an arc melting apparatus. The alloy ingot thus produced was coarsely ground in a mortar, and then dry ground to 100 μm or less by using a planetary rotary ball mill. The resulting alloy powder was press molded (Molding pressure: 7 tons/cm$^2$), and a sintered body was obtained by heat the molded body at 600 to 650° C. for 48 hours.

Among the starting materials, Pb is an impure element to make the thermoelectric conversion material n-type. Instead of Pb, other impure element or elements such as Ni, Fe, Ru, Sn, Te and/or Se may be used to realize a specific conduction type. The powder to be fired is not necessarily limited to the above one obtained by melting the starting materials and grinding the ingot. For example, a mixed powder obtained by measuring powdery elementary starting materials to give an intended composition and mixing them, or a mixed powder obtained by mixing a powder produced by melting and grounding with a single elementary powder to give a composition having an intended ratio between the elements.

With respect to sintered samples obtained in this experiment by way of example, the preparatory composition and the relationship between the preparatory composition and the volumetric rate of the Sb phase in the sintered body are shown in the following Table 1. With respect to sintered samples obtained in this experiment by way of example, the relationship among the volumetric rate of the Sb phase contained in the sintered body, and the crystalline phases constituting the sintered body, the bulk density, and strength measured at room temperature are shown in the following Table 2. The constituent crystalline phases were determined by the powder X-ray diffraction measurement method. In this case, whether the Sb phase existed or not was determined whether diffraction lines of Sb phase existed in a powder X-ray diffraction pattern or not. The detection limit of the volumetric rate of the Sb phase in the powder X-ray diffraction measurement method is about 0.3 vol %. An example of a measurement result (Sb: 16.5 vol. %) in the powder X-ray diffraction measurement method is shown in FIG. 1. An observed view of a polished sectional face of a sample having a preparatory composition Sb/Co(+additives)=3.5 by an electron microscope are shown in FIG. 2(a), and analysis results of the composition at points A and B in FIG. 2(a) by the energy dispersion X-ray analysis method (ED) are shown in FIGS. 2(b) and 2(c).

TABLE 1

| Sample No. | Preparatory Composition | Volumetric ratio (%) of Sb phase |
|---|---|---|
| 1 | $Co_{0.97}Pd_{0.03}Sb_{3.20}$ | 2.4 |
| 3 | $Co_{0.97}Pd_{0.03}Sb_{3.31}$ | 8.4 |
| 4 | $Co_{0.97}Pd_{0.03}Sb_{3.4}$ | 9.8 |
| 5 | $Co_{0.97}Pd_{0.03}Sb_{3.45}$ | 11.1 |
| 6 | $Co_{0.97}Pd_{0.03}Sb_{3.6}$ | 13.8 |
| 7 | $Co_{0.97}Pd_{0.03}Sb_{3.7}$ | 14.1 |
| 9 | $Co_{0.97}Pd_{0.03}Sb_{4.0}$ | 21.4 |
| 10 | $Co_{0.97}Pd_{0.03}Sb_{3.00}$ | 0 |
| 11 | $Co_{0.97}Pd_{0.03}Sb_{2.99}$ | 0 |
| 14 | $Co_{0.97}Pd_{0.03}Sb_{2.98}$ | 0 |
| 15 | $Co_{0.97}Pd_{0.03}Sb_{2.97}$ | 0 |

TABLE 2

| | Preparatory composition | Firing temp. (° C.) | Sintered phase produced | Bulk density (g/cm$^3$) | Strength at room temp. |
|---|---|---|---|---|---|
| Example | $Co_{0.97}Pd_{0.03}Sb_{3.12}$ | 640 | $CoSb_3$ phase, Sb phase | 6.6 | 145 |
| | $Co_{0.97}Pd_{0.03}Sb_{3.2}$ | 640 | $CoSb_3$ phase, Sb phase | 6.7 | 135 |
| Comparative Example | $Co_{0.97}Pd_{0.03}Sb_{3.61}$ | 640 | $CoSb_3$ phase, Sb phase | 6.6 | 141 |
| | $Co_{0.97}Pd_{0.03}Sb_{4.10}$ | 640 | $CoSb_3$ phase, Sb phase | 6.8 | 129 |
| | $Co_{0.97}Pd_{0.03}Sb_{3.83}$ | 640 | $CoSb_3$ phase, Sb phase | 6.8 | 137 |
| | $Co_{0.97}Pd_{0.03}Sb_{2.99}$ | 600 | $CoSb_3$ phase, $CoSb_2$ phase | 4.3 | 31 |
| | $Co_{0.97}Pd_{0.03}Sb_{2.99}$ | 640 | $CoSb_3$ phase, $CoSb_2$ phase | 4.3 | 24 |
| | $Co_{0.97}Pd_{0.03}Sb_{2.99}$ | 650 | $CoSb_3$ phase, $CoSb_2$ phase | 4.2 | 21 |
| | $Co_{0.97}Pd_{0.03}Sb_{2.98}$ | 600 | $CoSb_3$ phase, $CoSb_2$ phase | 4.0 | 41 |
| | $Co_{0.97}Pd_{0.03}Sb_{2.97}$ | 650 | $CoSb_3$ phase, $CoSb_2$ phase | 4.3 | 19 |

As is clear from the results shown in Table 1, if the ratio of Sb/Co in the preparatory composition is not more than 3.4, the volumetric rate of the Sb phase contained in the sintered body is less than 10 vol. % Further, as is clear from the results shown in Table 2, if Sb is contained to let the preparatory composition x=Sb/(Co+additives) in which 3<x<3.4, only the Sb phase is contained as a constituting phase besides the cubic $CoSb_3$ phase, and a dense sintered body having a small amount of voids is obtained. Further, as is clear from the results shown in FIGS. 1 and 2, the Sb phase is a main component of the grain boundary phase in the case of the sintered body containing excess Sb in the composition $CoSb_3$. Furthermore, in such a material, it is clear from the results in Table 2 that strength at room temperature is largely increased.

FIG. 3 shows dependency of the electrical conductivity σ (S/m) upon the volumetric rate of the contained Sb phase at 250° C. with respect to the cobalt-antimony thermoelectric sintered bodies containing various amounts of the Sb phase in this experiment. In FIG. 3 is shown a conventional range of electrical conductivities reported in K. Matsubara, T. Iyanaga, T. Tsubouchi, K. Kishinoto and T. Koyanagi, American Institute of Physics (1995) pp. 226–229. The volumetric rate of the Sb phase in each of those samples was quantitatively measured by the powder X-ray diffraction measurement method. As is clear from the results shown in FIG. 3, the electrical conductivity is largely increased by excessively incorporating the Sb phase into the composition of $CoSb_3$. Further, it is clear that the electrical conductivity of the sample containing about 0.3 vol. % of the Sb phase near the detection limit in the quantitative measurement is largely enhanced as compared with a sample containing no Sb phase.

FIG. 4 shows dependency of the electric factor Q (W/mK$^2$) upon the volumetric rate of the contained Sb phase at 250° C. with respect to the cobalt-antimony thermoelectric sintered bodies containing various amounts of the Sb phase. In FIG. 4 is shown a conventional range of power factors in K. Matsubara, T. Iyanaga, T. Tsubouchi, K. Kishinoto and T. Koyanagi, American Institute of Physics (1995) pp. 226–229. The volumetric rate of the Sb phase in each of those samples was quantitatively measured by the powder X-ray diffraction measurement method. As is clear from the results shown in FIG. 4, the optimum volumetric rate of the Sb phase relating to the thermoelectric characteristics is around 2 vol. %. Further, it is clear that the power factor Q (W/mK$^2$) of a cobalt-antimony thermoelectric sintered sample having the volumetric rate of the Sb phase being around 9.8 vol. % is far greater as compared with a sample containing around 11 vol. % of the Sb phase, and also sufficiently higher greater than the conventional samples.

On the other hand, it is clear that the power factor Q (W/mK$^2$) a sample containing around 0.3 vol. % of the Sb phase is far greater than that of a sample containing no Sb phase, and sufficiently higher than that of the conventional samples. Therefore, as is clear from the results shown in FIG. 4, the power factor Q (W/mK$^2$) is largely increased by excessively incorporating the Sb phase as the semi-metal within a given range but beyond the stoichiometric composition as compared with the sample containing no Sb phase. Thus, the thermoelectric conversion material having further enhanced thermoelectric characteristics and electrical conductivity can be offered. As is clear from the results shown in Table 2, when the Sb phase is excessively incorporated into the composition of $CoSb_3$, the sintered body is further densified to obtain the material having high strength at room temperature. In addition, since the dense sintered body having high strength and thermoelectric characteristics, particularly high electrical conductivity can be obtained by the general sintering process, the present invention can provide the industrially effective process for effectively producing the thermoelectric conversion material having high strength and high performance at a low cost.

Furthermore, the thermoelectric conversion materials containing the p-type or n-type impurity or impurities have the same crystalline structures. Therefore, since the materials are deemed to have the same thermal stability and the coefficient of thermal expansion, powders can be easily molded for pn joining. Further, the thermoelectric conversion material can be offered, which has chemical stability and thermal characteristics not deteriorated over a wide temperature range from roan temperature to 300° C. and which has high heat resistance, excellent moldability and economical advantages. In addition, the process for the production of such a thermoelectric conversion material can be offered.

As mentioned above, since the thermoelectric conversion material according to the present invention is composed mainly of the cobalt-antimony compound and the Sb phase is contained as the secondary phase besides cubic $CoSb_3$ as the main component, the material can be offered, which has high strength, further enhanced thermoelectric characteristics, particularly electrical conductivity, and heat resistance and chemical stability allowing sufficient use in a temperature range from near roam temperature to not less than 300° C., and is unlikely to be deteriorated in performance.

According to the process for the production of the thermoelectric conversion material, the powder having the elementary content rate x=Sb/(Co+additives) (3<x<3.4) is press molded, and the molded body is thermally treated in the non-oxidizing atmosphere. Therefore, since the dense thermoelectric conversion sintered body having high thermoelectric characteristics can be obtained by the general sintering process, the present invention can provide the industrially effective thermoelectric conversion material-producing process, which can effectively mass-produce the thermoelectric conversion material having high performance at a low cost.

What is claimed is:

1. A thermoelectric conversion material comprising a sintered body comprising (i) a cubic $CoSb_3$ compound and (ii) a secondary Sb phase, wherein a volumetric ratio of the secondary Sb phase to the entire thermoelectric conversion material is less than 10 vol % and greater than 0 vol %.

2. The thermoelectric conversion material set forth in claim 1, wherein said sintered body comprises particles of the cubic $CoSb_3$, grain boundaries comprising the Sb phase, and voids.

3. A process for producing a thermoelectric conversion material comprising a sintered body comprising (i) a cubic $CoSb_3$ compound and (ii) a secondary Sb phase, wherein a volumetric ratio of the secondary Sb phase to the entire thermoelectric conversion material is less than 10 vol % and greater than 0 vol %, said process comprising press molding a powder comprising cobalt and antimony, and thermally treating the thus-molded product in a non-oxidizing atmosphere at a temperature greater than a liquid phase precipitating temperature of Sb, wherein an elementary content ratio of Sb/(Co+additives) is greater than 3 and less than 3.4.

* * * * *